US009373955B2

(12) United States Patent
Chen

(10) Patent No.: US 9,373,955 B2
(45) Date of Patent: Jun. 21, 2016

(54) DEVICES AND METHODS RELATED TO ELECTROSTATIC DISCHARGE-PROTECTED CMOS SWITCHES

(71) Applicant: Skyworks Solutions, Inc., Woburn, MA (US)

(72) Inventor: Ying-Kuang Chen, Newbury Park, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 757 days.

(21) Appl. No.: 13/737,807

(22) Filed: Jan. 9, 2013

(65) Prior Publication Data

US 2013/0194158 A1 Aug. 1, 2013

Related U.S. Application Data

(60) Provisional application No. 61/584,705, filed on Jan. 9, 2012.

(51) Int. Cl.
*H02H 9/04* (2006.01)
*H01L 27/02* (2006.01)
*H01Q 1/50* (2006.01)

(52) U.S. Cl.
CPC ........... *H02H 9/045* (2013.01); *H01L 27/0251* (2013.01); *H01Q 1/50* (2013.01)

(58) Field of Classification Search
CPC ............................ H02H 9/045; H01L 27/0251
USPC ........................................................ 326/31
See application file for complete search history.

(56) References Cited

U.S. PATENT DOCUMENTS

| | | | | |
|---|---|---|---|---|
| 6,281,737 B1 * | 8/2001 | Kuang | ................. | H03K 17/162 327/382 |
| 6,504,212 B1 * | 1/2003 | Allen | ................... | G11C 7/1048 257/347 |
| 6,804,502 B2 * | 10/2004 | Burgener | ................. | H01P 1/15 257/341 |
| 7,868,683 B2 * | 1/2011 | Ilkov | ................ | H03K 17/04123 327/374 |
| 8,847,672 B2 * | 9/2014 | Prabhakar, III | ..... | H01L 27/0629 327/434 |
| 2002/0071230 A1 | 6/2002 | Colclaser et al. | | |
| 2002/0075614 A1 | 6/2002 | Li | | |

(Continued)

FOREIGN PATENT DOCUMENTS

JP       2011-188102 A       9/2011

OTHER PUBLICATIONS

International Search Report and Written Opinion re International Application No. PCT/US2013/020902 mailed on Apr. 30, 2013.

(Continued)

*Primary Examiner* — Dylan White
(74) *Attorney, Agent, or Firm* — Knobbe, Martens, Olson & Bear, LLP

(57) ABSTRACT

Disclosed are devices and methods related to a CMOS switch for radio-frequency (RF) applications. In some embodiments, the switch can be configured to include a resistive body-floating circuit to provide improved power handling capability. The switch can further include an electrostatic discharge (ESD) protection circuit disposed relative to the switch to provide ESD protection for the switch. Such a switch can be implemented for different switching applications in wireless devices such as cell phones, including band-selection switching and transmit/receive switching.

15 Claims, 9 Drawing Sheets

(56) References Cited

U.S. PATENT DOCUMENTS

| | | | | |
|---|---|---|---|---|
| 2009/0073078 A1* | 3/2009 | Ahn | ............... | H03K 17/063 343/876 |
| 2009/0167270 A1* | 7/2009 | Lam | ............... | G06F 1/26 323/283 |
| 2011/0105055 A1* | 5/2011 | Ilkov | ............... | H01P 1/15 455/93 |
| 2013/0016447 A1* | 1/2013 | Kitabata | ............... | H05K 9/0067 361/56 |

OTHER PUBLICATIONS

F.-J. Huang and K.K.O, "A 0.5-μm CMOS T/R switch for 900-MHz wireless applications," IEEE J. Solid-State Circuits, vol. 36, No. 3, pp. 486-492, Mar. 2001.

F.-J. Huang and K.K.O, "Single-pole double-throw CMOS switches for 900-MHz and 2.4-GHz application on P-silicon substrates," IEEE J. Solid-States Circuits, vol. 39, No. 1, pp. 35-41, Jan. 2004.

N Talwalkar, C. Yue, H. Guan, and S. Wong, "Integrated CMOS transmit-receive switch using LC-tuned substrate bias for 2.4 GHz and 5.2 GHz applications," IEEE J. Solid-State Circuits, vol. 39, No. 6, pp. 863-870, Jun. 2004.

M.-C. Yeh, Z.-M. Tsai, R.-C. Liu, K.-Y. Lin, Y.-T. Chang, and H. Wang, "Design and analysis for a miniature CMOS SPDT switch using body-floating technique to improve power performance," IEEE Trans. Microw. Theory Tech., vol. 54, No. 1, pp. 31-39, Jan. 2006.

M. Ahn, H.-W. Kim, C.-H. Lee, and J. Laskar, "A 1.8-GHz 33-dBm P 0.1-Db CMOS T/R switch using stacked FETs with feed-forward capacitors in a floated well structure," IEEE Trans. Microw. Theory Tech., vol. 57, No. 11, pp. 2661-2670, Nov. 2009.

H. Xu and K.K.O, "A 31.3-dBm bulk CMOS T/R switch using stacked transistors with sub-design-rule channel length in floated p-wells," IEEE J. Solid-State Circuits, vol. 42, No. 11, pp. 2528-2534, Nov. 2007.

* cited by examiner

DEVICES AND METHODS RELATED TO ELECTROSTATIC DISCHARGE-PROTECTED CMOS SWITCHES

CROSS-REFERENCE TO RELATED APPLICATIONS

This application claims priority to U.S. Provisional Application No. 61/584,705 filed Jan. 9, 2012 and entitled "AN ESD-PROTECTED MINIATURE CMOS RF SINGLE-POLE-DOUBLE-THROW SWITCH IN MCM PACKAGE FOR WIRELESS APPLICATIONS," which is expressly incorporated by reference herein in its entirety.

BACKGROUND

1. Field

The present disclosure generally relates to devices and methods related to electrostatic discharge-protected CMOS switches for wireless applications.

2. Description of the Related Art

Complementary metal-oxide-semiconductor (CMOS) technology can be implemented in radio-frequency (RF) switches in some wireless communication systems. Low-cost silicon bulk CMOS technologies can be utilized in wireless applications such as switching of RF signals. For example, a multi-throw switch can provide an important front-end functionality of routing RF signals to and/or from an antenna.

It is desirable for RF switches to have some or all of performance parameters such as low insertion loss (IL), high linearity, and power handling capability. Such performance parameters are now emerging in configurations such as silicon bulk CMOS and silicon-on-insulator (SOI).

SUMMARY

According to a number of implementations, the present disclosure relates to a radio-frequency (RF) switching apparatus that includes a switch implemented as a CMOS device. The switch includes a resistive body-floating circuit configured to provide desired power handling capability of the switch. The switching apparatus further includes an electrostatic discharge (ESD) protection circuit disposed relative to the switch and configured to provide ESD protection for the switch.

In some embodiments, the switch can be an N-pole-M-throw switch, with N having an integer value greater than 0, and M having an integer value greater than 1. A single-pole-double-throw (SPDT) switch can be an example of such a switch.

In some embodiments, the switching apparatus can further include a packaging substrate, with the switch and the ESD protection circuit being mounted on the packaging substrate. The packaging substrate can be a part of a multi-chip-module (MCM).

In some embodiments, the resistive body-floating component can be implemented as a CMOS device. The resistive body-floating component can include a body-floating resistor implemented in a bulk CMOS technology such as a 0.18 µm bulk CMOS technology.

In some embodiments, the ESD protection circuit can include one or more diodes. In some embodiments, the ESD protection circuit can be implemented at one or more ports of the switch, such as antenna port.

In some embodiments, the switching apparatus can further include a controller configured to control the switch. In some embodiments, the controller and the switch can be integrated. The controller can include a bandgap reference, a low dropout voltage regulator (LDO), and a digital logic.

In a number of implementations, the present disclosure relates to a method for fabricating a radio-frequency (RF) switching apparatus. The method includes forming a CMOS switch. The method further includes forming a resistive body-floating circuit for the switch. The method further includes forming or providing an electrostatic discharge (ESD) protection circuit to provide ESD protection for the switch.

According to some implementations, the present disclosure relates to a radio-frequency (RF) module that includes a packaging substrate configured to receive a plurality of components. The module further includes a switch implemented as a CMOS device and mounted on the packaging substrate. The switch includes a resistive body-floating circuit configured to provide desired power handling capability of the switch. The module further includes an electrostatic discharge (ESD) protection circuit mounted on the packaging substrate and disposed relative to the switch to provide ESD protection for the switch.

In some embodiments, the module can be a multi-chip-module (MCM) such as a laminated MCM (MCM-L). In some embodiments, the module can further include a controller configured to control the switch. The controller and the switch can be integrated.

In accordance with a number of implementations, the present disclosure relates to a wireless device that includes an antenna configured to facilitate transmission and reception of radio-frequency (RF) signals. The wireless device further includes a radio-frequency (RF) module in communication with the antenna. The RF module includes a switch implemented as a CMOS device. The switch includes a resistive body-floating circuit configured to provide desired power handling capability of the switch. The RF module further includes an electrostatic discharge (ESD) protection circuit disposed relative to the switch to provide ESD protection for the switch.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
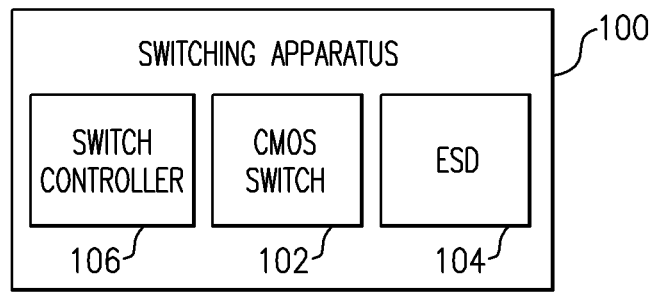
FIG. 1 schematically depicts a switching apparatus having a CMOS switch and an electrostatic discharge (ESD) protection component.

FIG. 1 schematically shows a switching apparatus 100 having a CMOS switch 102 and an electrostatic discharge (ESD) protection circuit 104. In some embodiments, the switching apparatus can also include a switch controller 106. Examples of the foregoing components are described herein in greater detail.

In some embodiments, the switching apparatus 100 of FIG. 1 can be implemented as a multi-chip-module (MCM) such as a laminated MCM (MCM-L). Although described in such an example context, it will be understood that one or more features of the present disclosure can also be implemented in other packaging configurations.

Disclosed herein are example configurations of a switching apparatus that can provide advantageous features such as low cost, small size, desirable performance, and ESD-protection capability. By way of an example, an MCM-packaged and ESD-protected RF single-pole-double-throw (SPDT) switch can be fabricated in an example 0.18 μm bulk CMOS technology. A switch controller having a bandgap reference, low dropout voltage regulators (LDO), and level shifters can also be integrated, and such a configuration is shown to consume about 40 μA from a 3.4 V supply.

In some embodiments, the foregoing example switch can be based upon resistive body-floating technique. In the context of an example triple-well MOSFETs, such a switch can achieve an insertion loss of approximately 0.55/0.69/0.81 dB at approximately 0.9/1.95/2.45 GHz, respectively. TX-to-RX isolation of >28 dB and return loss of >14 dB can be achieved at these frequencies. The measured input 1 dB compression point ($IP_{1dB}$) of approximately 21.5/21.1/20.8 dBm and input $3^{rd}$ order intercept point ($IIP_3$) of approximately 38.5/37.8/36.9 dBm can be accomplished at approximately 0.9/1.95/2.45 GHz, respectively. The example core switch size is approximately 0.02 mm$^2$. At 2.45 GHz, the example switch shows a worst-case insertion loss of approximately 0.9 dB at 85° C. The example switch achieves an RF electrostatic discharge (ESD) rating of >4 kv for the ±2 kV human body model (HBM) and >500 V for the ±200 V machine model (MM).

In some embodiments, desirable features such as the foregoing example performance features can be implemented in low-cost silicon bulk CMOS technologies for wireless communication systems. In such wireless systems, high power amplifier and double or multi-throw switch are two important front-end components that can be integrated to realize a more complete system-on-chip (SOC) for wireless transceivers. Switches with low insertion loss (IL), high linearity, and moderate to high power handling capability that were once implemented in III-V compound semiconductors such as GaAs pHEMT can be implemented in silicon bulk CMOS and silicon-on-insulator (SOI).

Figure 2A:
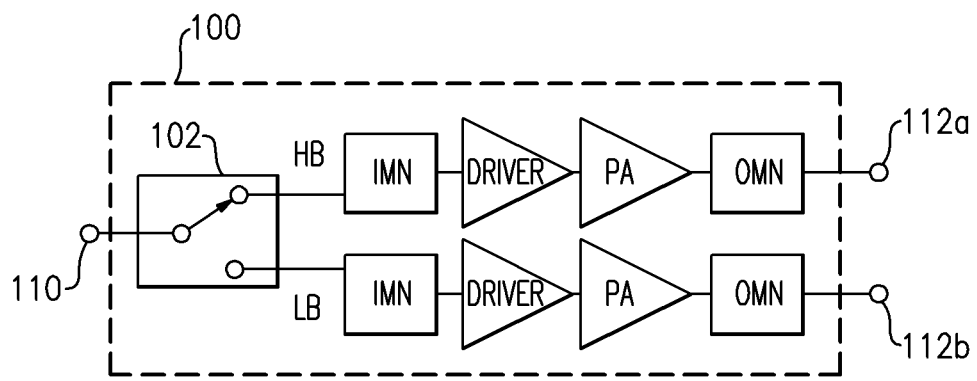
FIG. 2A shows an example of how the switching apparatus of FIG. 1 can be implemented in a wireless system.
Figure 2B:
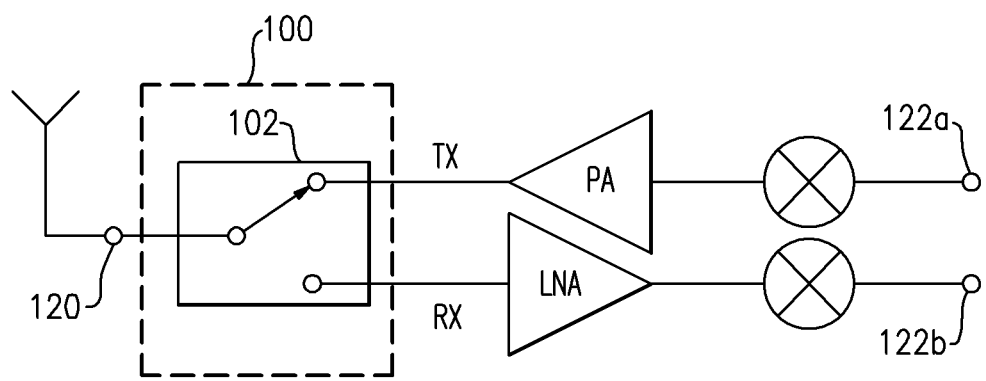
FIG. 2B shows another example of how the switching apparatus of FIG. 1 can be implemented in a wireless system.

FIGS. 2A and 2B show examples of how a switching apparatus 100 having one or more features as described herein can be implemented in wireless systems. Although described in the context of the switch being an SPDT switch, it will be understood that such a switch can have different number of poles and/or different number of throws.

FIG. 2A shows an example SPDT switch 102 being used as an input band selection switch. Such a switch can be part of a switching apparatus 100 which can also include an ESD protection circuit (not shown). The single pole of the switch 102 is shown to be connected to an input node 110, and the two throws of the switch 102 are shown to be connected to a high band (HB) path and a low band (LB) path. The high band path is shown to include an input matching network (IMN) and a driver for a power amplifier (PA). An out output of the PA is shown to be subjected to an output matching network (OMN) before reaching a high band output node 112a. Similarly, the low band path is shown to include an input matching network (IMN) and a driver for a power amplifier (PA). An out output of the PA is shown to be subjected to an output matching network (OMN) before reaching a low band output node 112b.

In some embodiments, the switching apparatus 100 can be part of a PA module. For example, a dual-band WCDMA PA module can include the foregoing high band (e.g., B1 at 1920-1980 MHz, B2 at 1850-1910 MHz, B4 at 1710-1785 MHz) and low band (e.g., B5 at 824-849 MHz, B8 at 880-915 MHz). The switch 102 can function as an input band select switch for switching between the high and low bands.

FIG. 2B shows an example SPDT switch 102 being used as transmit/receive (T/R) switch. Such a switch can be part of a switching apparatus 100 which can also include an ESD protection circuit (not shown). In some embodiments, the switching apparatus 100 can be part or a front end architecture or module.

Referring to FIG. 2B, the single pole of the switch 102 is shown to be connected to an antenna port 120, which is in turn connected to an antenna. The two throws of the switch 102 are shown to be connected to an output of a transmit (TX) path and an input of a receive (RX) path. The TX path is shown to include an input node 122a, and an RF signal to be transmitted can enter the node 122a and pass through a mixer before being amplified by a power amplifier (PA). The RX path is shown to include a low-noise amplifier (LNA) that receives an RF signal received by the antenna and routed through the second throw of the switch 102. The LNA-amplified signal is shown to pass through a mixer before being routed to an output node 122b.

In both of the foregoing examples, insertion loss (IL), isolation, and linearity can be important performance parameters. For high power applications such as GSM, a requirement for power handling capability ($IP_{1dB}$) can be even more stringent. Design for low IL on silicon can typically be achieved by selecting an optimal device size (especially on conductive silicon substrate) for a given technology, low substrate resistance ($R_{sub}$), and high $R_{sub}$. Depending on the target applications, design techniques for enhancing the power handling capability such as using high $R_{sub}$, impedance transformation, LC tuned substrate biasing in a twin well process, and resistive body-floating can be utilized. For even higher power applications, multiple stacked devices with feed-forward capacitors and body-floating techniques can also be implemented.

In some embodiments, an RF ESD-protected and area-efficient switch (e.g., an SPDT switch) with an integrated switch controller can be implemented in a laminated multi-chip-module (MCM-L). MCM-L package, featuring a laminate substrate with land grid array (LGA)-type perimeter pads, can provide advantageous features including high-density interconnect to achieve small package footprint, low ground RF inductance, and effective heat dissipation. MCM-L can also facilitate integration with other front-end components such as GaAs HBT PA and GaAs pHEMT LNA more conveniently.

Although described in the context of SPDT configuration, one or more features of the present disclosure can also be implemented in other switch configurations. For example a switch can include more than one pole and/or a number of throws different than two.

Example SPDT Switch Design

An SPDT switch and integrated switch controller were implemented in TowerJazz standard 0.18 μm bulk CMOS technology. This low-cost CMOS process includes four metal layers, deep n-well devices, and has a relatively low substrate resistivity ($\rho_{si}$) of approximately 3 Ω-cm.

Figure 3:
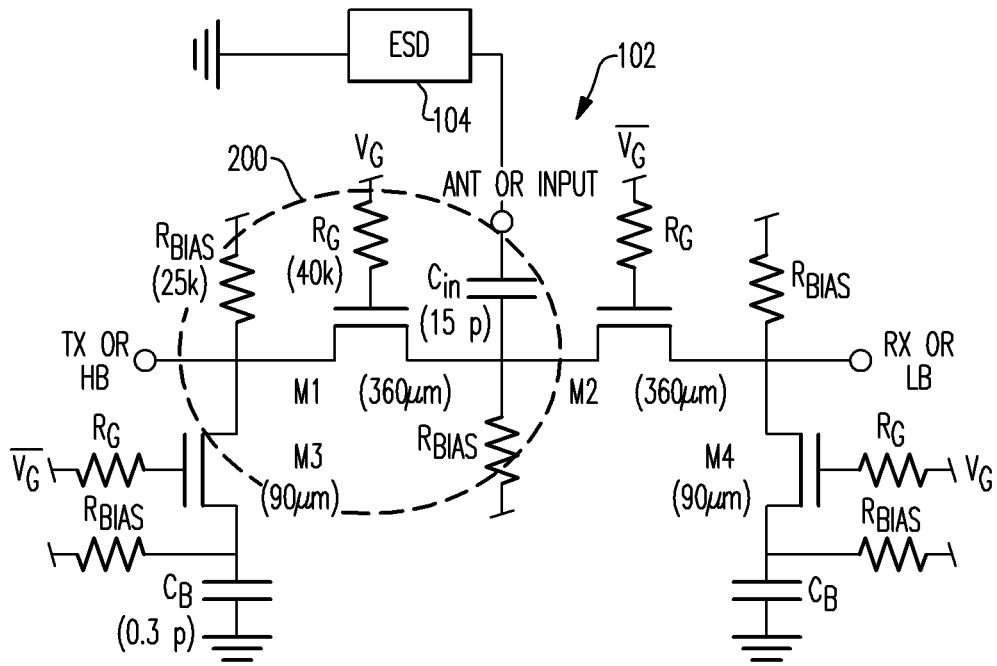
FIG. 3 shows an example of the CMOS switch of FIG. 1 implemented in an SPDT configuration.
Figure 4:
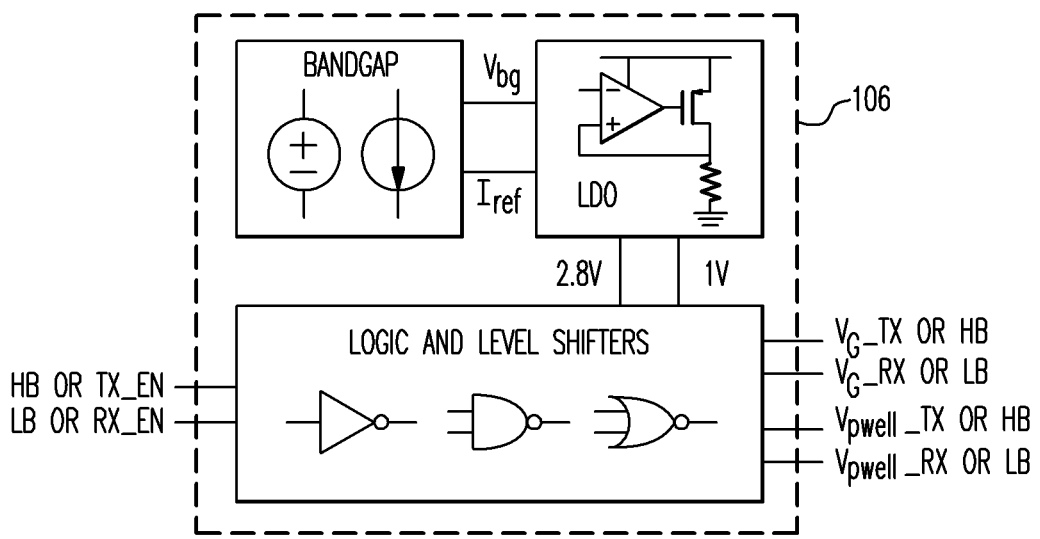
FIG. 4 shows an example of a switch controller that can be implemented as a part of the switching apparatus of FIG. 1.

Schematic diagrams of the switch 102 and switch controller 106 are shown in FIGS. 3 and 4. The example SPDT switch design includes two series FETs (M1=M2=approximately 360 μm) and two shunt FETs (M3=M4=approximately 90 μm). The switch 102 is designed based on series-shunt architecture that helps improve the isolation performance at the expense of insertion loss. Blocking capacitors $C_B$ are used at the sources of the shunt arms which are biased through an approximately 25 kΩ $R_{Bias}$.

In some implementations, the biasing of the switch 102 can be internally generated by an integrated switch controller 106 of FIG. 4. Such a switch controller can include, for example, a bandgap reference, low dropout voltage regulators (LDO), and digital logics.

In FIGS. 3 and 4, values shown for various devices and elements are examples. It will be understood that other values can also be implemented.

Figures 5A, 5B:
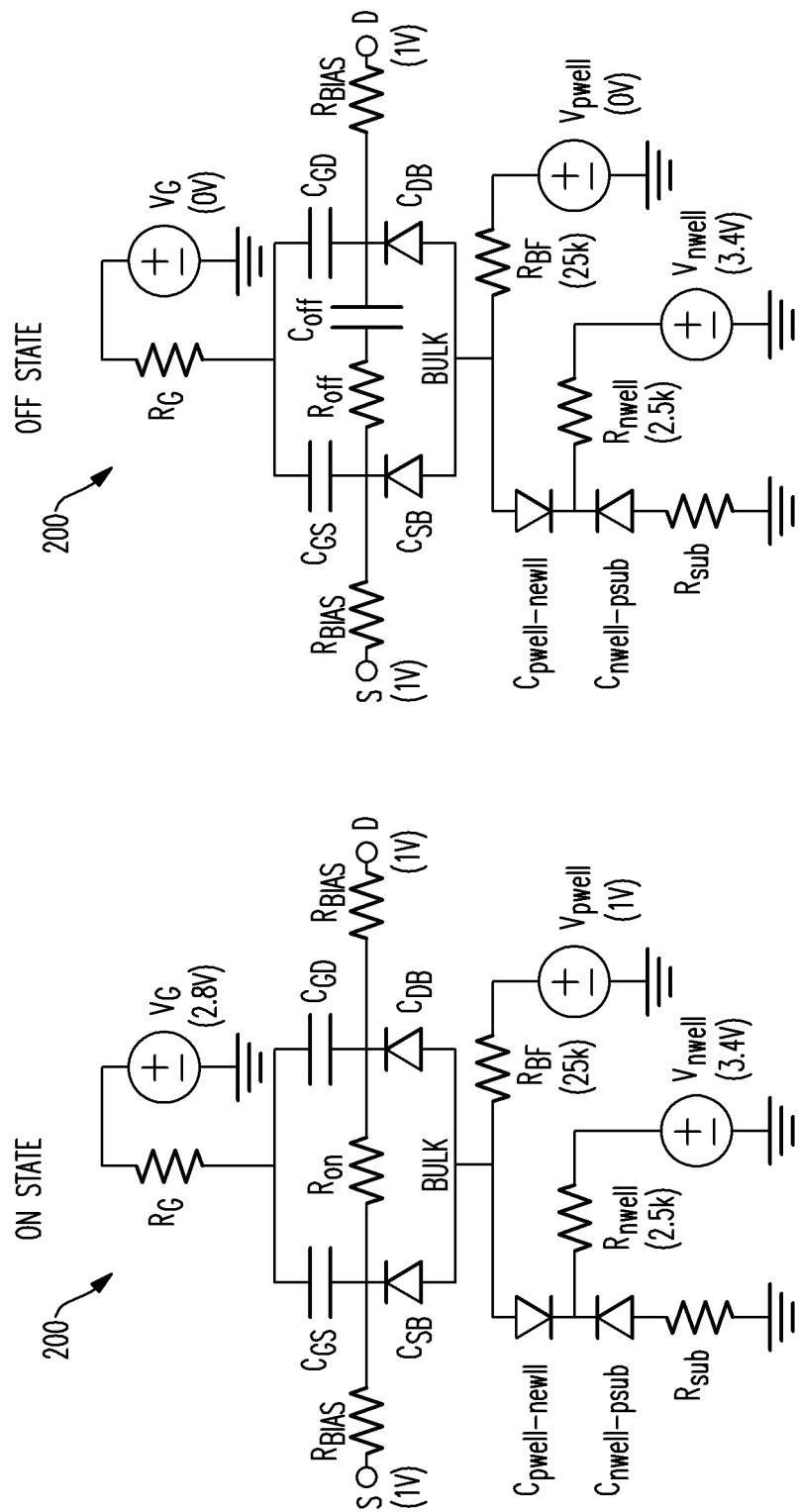
FIGS. 5A and 5B show ON and OFF states of an example triple-well field-effect transistor (FET) that can provide switching functionality of the switch of FIG. 1.

In some embodiments, at least some of the FETs of FIG. 3 can be implemented as a triple-well FET. An example of an equivalent circuit configuration 200 of the triple-well FET with biasing for both ON- and OFF-state is shown in FIGS. 5A and 5B.

In the ON-state, $V_{SB}/V_{DB}$ can be set to approximately 0 V for best IL (no bulk effect) for a given $V_G$. High value unsilicided poly gate resistors ($R_G$=approximately 40 kΩ) can be used to further improve IL and mitigate the degradation in power handling capability at high input power.

In some embodiments, a body-floating resistor ($R_{BF}$) (e.g., $R_{BF}$=approximately 25 kΩ) can be introduced to ensure or increase the likelihood that the bulk terminal swings in accordance with the source/drain. Such a configuration can also allow the source/drain-to-bulk to be reversed-biased to achieve good linearity and avoid excessive capacitive coupling to the substrate. In some implementations, the latter can be important for attaining a low IL especially when operating at high frequencies.

In the OFF-state, $V_{SB}/V_{DB}$ can be biased at approximately 1 V in order to delay the turn-on of the junction diodes ($C_{SB}/C_{DB}$), thus improving the power handling capability. Consequently, the gate control voltage can be approximately 2.8 V for ON-state and approximately 0 V for OFF-state while the source and drain voltages can be biased at approximately 1 V (e.g., compromise between turn-on of $V_{GD}/V_{GS}$ and gate oxide breakdown for the OFF devices).

The nwell voltage ($V_{nwell}$) can be biased at $V_{DD}$ (e.g., approximately 3.4 V, highest possible without using a voltage multiplier or charge pump) to keep $C_{pwell-nwell}$ and $C_{nwell-psub}$ reversed-biased while improving the compression characteristics at high power levels. The example switch design is based on the thin-gate 1.8 V devices. By adopting the resistive body-floating technique and proposed biasing strategy, the peak voltages at across gate oxide can stay below the TDDB breakdown voltage (~3.2 V) of the 1.8 V devices.

In some embodiments, and as shown in the example of FIG. 3, RF ESD protection can also be implemented at the antenna (Ant) port which is typically exposed and most likely to encounter an ESD event. In some embodiments, such an ESD protection can be implemented with diodes. Design considerations such as the choice of the diode size and number of diode stacks can be traded off among, for example, gate oxide reliability, IL due to the diode parasitic capacitance and series resistance, and linearity. In the example design described herein, the number of series diode stack connected in anti-parallel to ground is four.

Figure 6A:
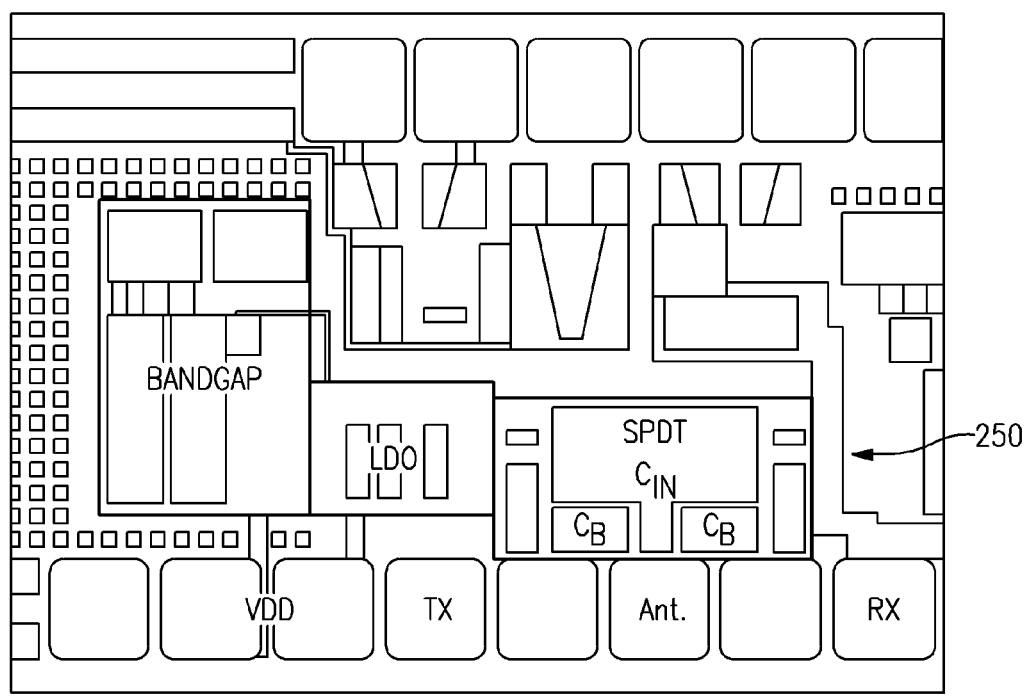
FIG. 6A shows an example of a switch core implemented as a single-pole-double-throw (SPDT) configuration.

In some implementations, the area of the example SPDT switch core 250 can be reduced by positioning at least some of the input ($C_{in}$) and output blocking ($C_B$) capacitors (e.g., see FIG. 3) on top of the active devices in a layout. Such a reduced SPDT switch core is shown in FIG. 6A, where both of the input ($C_{in}$) and output blocking ($C_B$) capacitors are on top of the active devices. As a result, the example core switch area is approximately 200 μm×100 μm (0.02 mm²). In comparison, the effective area for the switch controller (including the indicated LDO and bandgap) is approximately 0.04 mm².

Figure 6B:
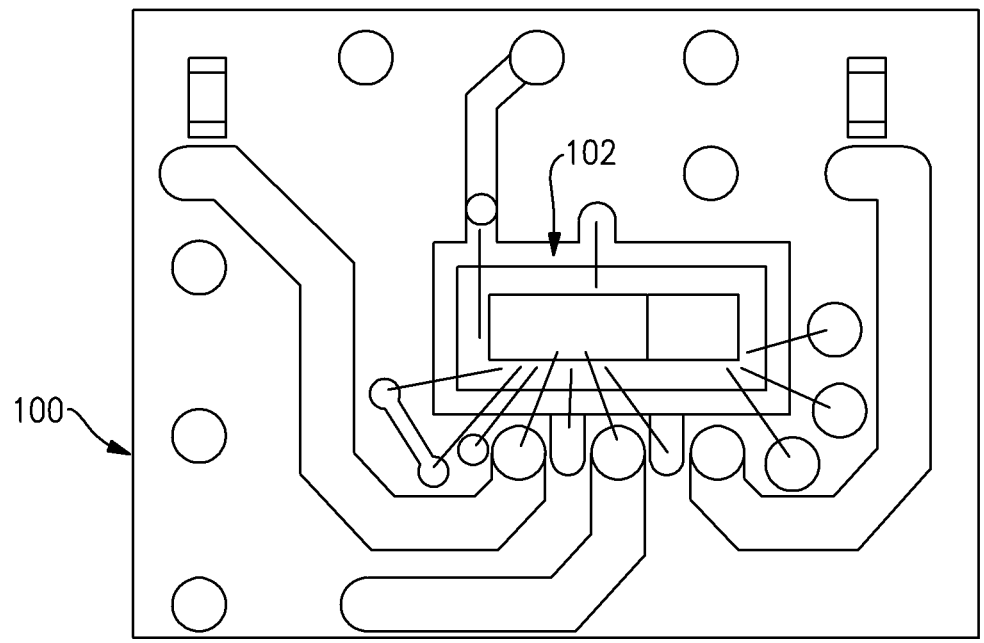
FIG. 6B shows an example of a silicon switch that is die-attached to a laminated multi-chip-module (MCM-L).

In some embodiments, the example SPDT switch can be implemented on a die utilizing CMOS technology. FIG. 6B shows an example of such a die having the switch 102 die-attached to an MCM-L package 100. For such a configuration, input and output traces and the effect of bondwires including isolation and return loss were simulated using 3D HFSS EM simulator.

Example Experimental Results

Figure 6C:
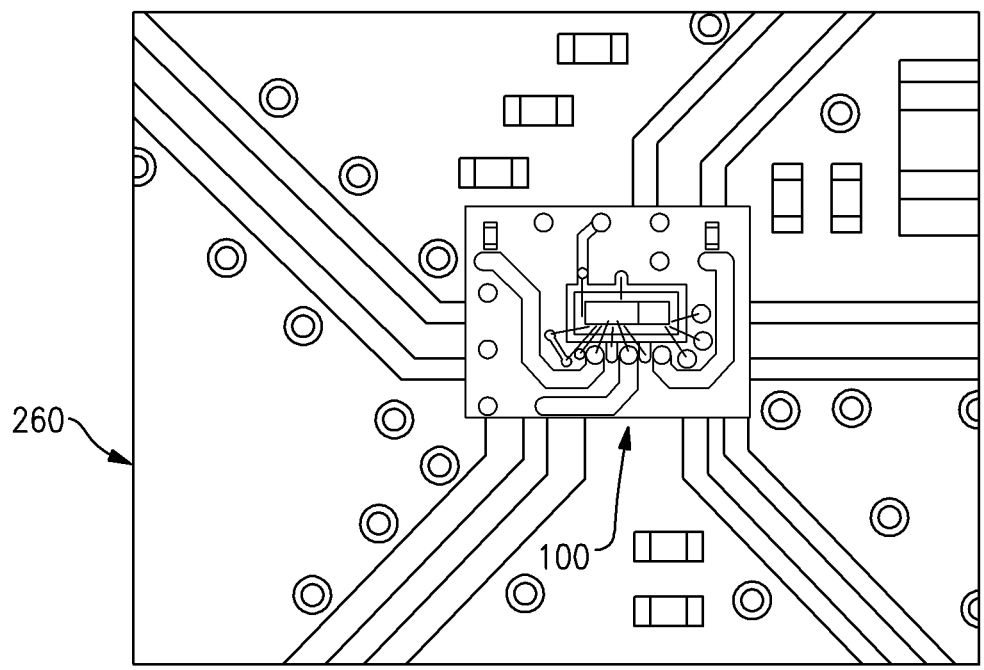
FIG. 6C shows the example MCM-L of FIG. 6B mounted on an evaluation board.

The example MCM-packaged switch 100 as described herein was mounted on an evaluation board 260 as shown in FIG. 6C. Temperature-dependent S-parameter measurement of the switch was performed using a four-port vector network analyzer (Rohde and Schwarz ZVA24) and temperature chamber. The loss and phase of the input and output CPW lines on the test fixture are accounted and de-embedded as much as possible. Due to the highly symmetrical packaged switch design, only the measurement data for TX-to-Ant path are shown.

Figure 7A:
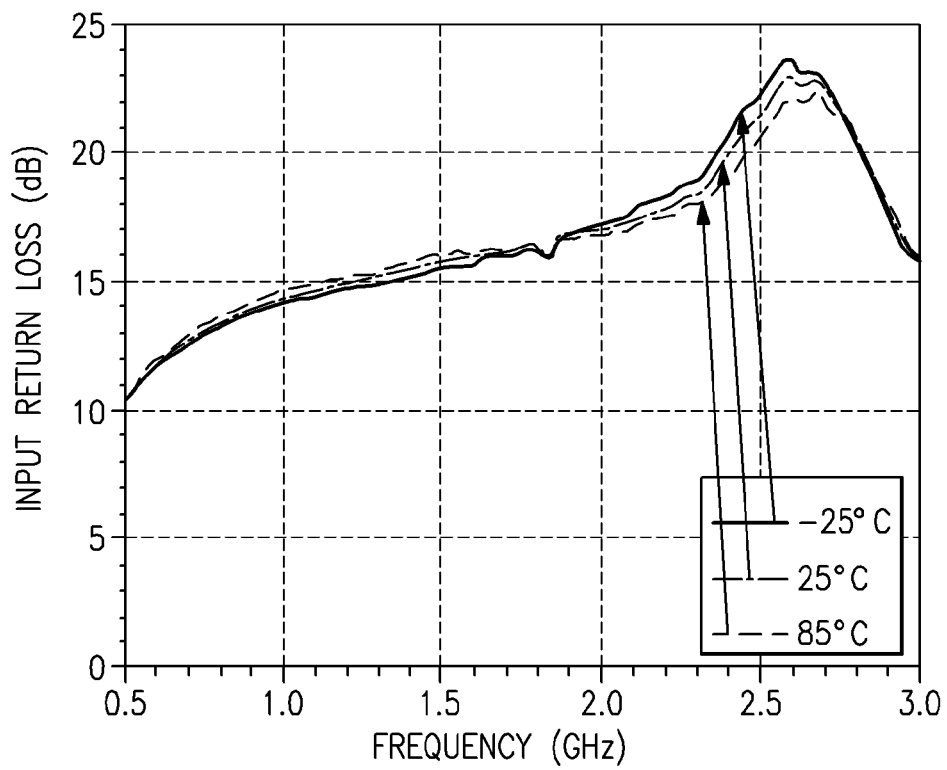
FIGS. 7A-7D show various examples of switching performance.
Figure 7B:
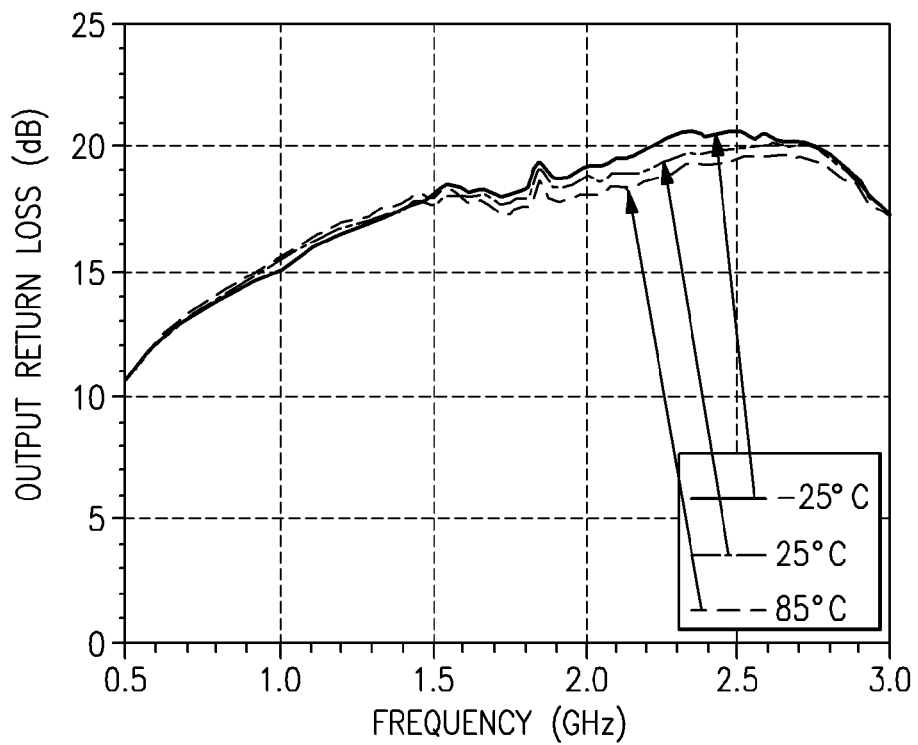

Between approximately 900 MHz and approximately 3 GHz, the switch achieves an input (TX port) return loss (RL) and output (Ant port) RL of >14 dB and >15 dB, respectively, from approximately −20° C. to approximately 85° C. (shown in FIGS. 7A and 7B). In some embodiments, the input and output bondwires and traces on the MCM-L can be used to further optimize or improve the RL performance.

Figure 7C:
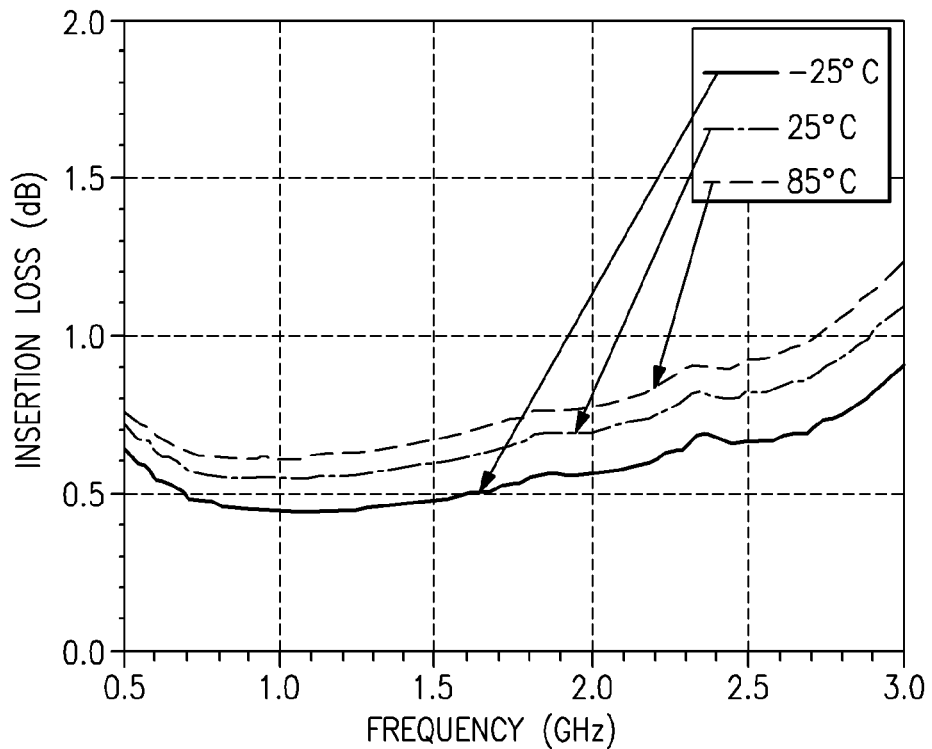

As shown in FIG. 7C, the measured insertion loss (IL) at the nominal temperature (25° C.) is approximately 0.55/0.69/0.81 dB at 0.9/1.95/2.45 GHz, respectively. Under the worst-case temperature (85° C.), the measured IL is approximately 0.61/0.78/0.9 dB at 0.9/1.95/2.45 GHz, respectively. This increase in IL at hot condition can be attributed to the mobility degradation of the FET device in strong inversion. The loss associated with the traces on the laminate is approximately 0.05/0.1/0.16 dB at 0.9/1.95/2.45 GHz, respectively.

Figure 7D:
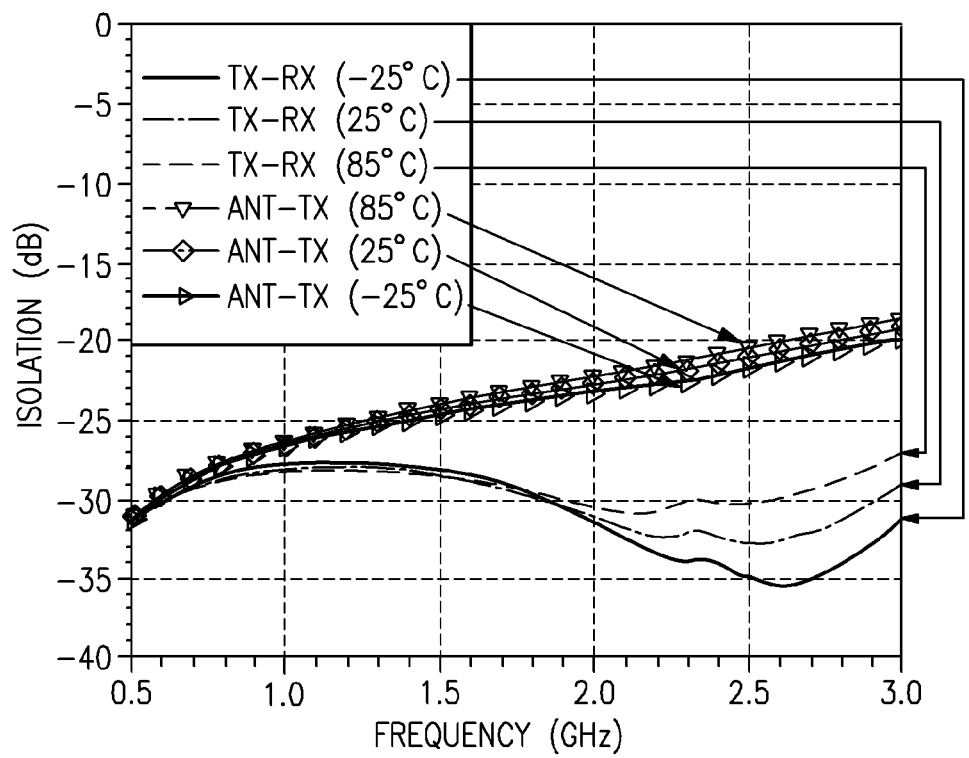

As shown in FIG. 7D, the isolation from TX-to-RX (TX mode) is >28 dB while the isolation from Ant-to-TX (RX mode) is >21 dB under the worst-case case (at 85° C.). In some embodiments, the input and output RF bondwires can be considered and leveraged between the return loss and isolation.

Figure 8:
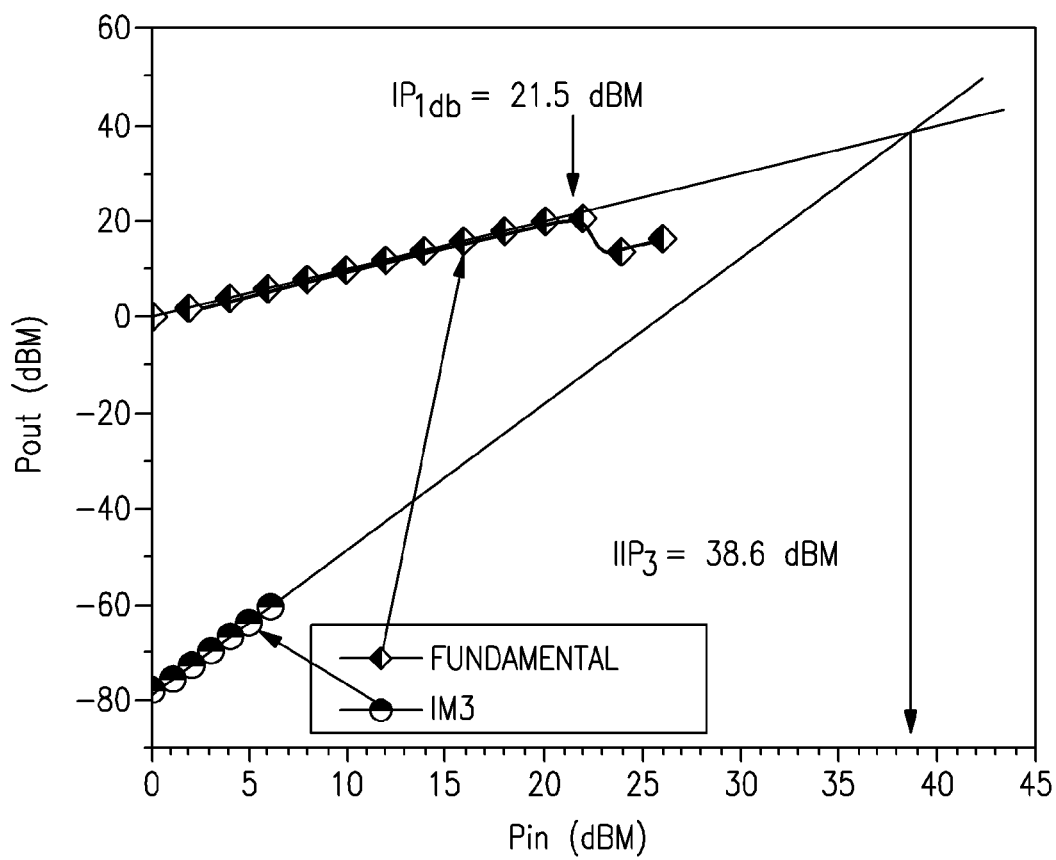
FIG. 8 shows examples of power handling performance.

The power handling capability ($IP_{1dB}$) of the switch was conducted with an external broadband power amplifier module (Mini-Circuits ZHL-4240W). As shown in FIG. 8, the measured $IP_{1dB}$ is approximately 21.5/21.1/20.8 dBm at 0.9/1.95/2.45 GHz, respectively. With 1 MHz frequency separation for the two-tone linearity test, the measured $IIP_3$ is approximately 38.5/37.8/36.9 dBm at 0.9/1.95/2.45 GHz, respectively. In the example measurements, the switch controller draws an overall current of ~40 µA from a 3.4 V supply.

The ESD test was demonstrated using a handheld mini-zapper (KeyTek TPC-2A) with both HBM and MM inserts. The switch has successfully survived a RF ESD rating of >4 kV and >500 V (for both positive and negative ESD strikes) for the target ±2 kV HBM and ±500 V MM, respectively.

Table 1 summarizes and compares the performance of prior published CMOS RF SPDT switches. Various values listed in Table 1 are approximate values.

tors with sub-design-rule channel length in floated p-wells," *IEEE J. Solid-State Circuits*, vol. 42, no. 11, pp. 577-584, November 2007.

Conclusion

As described herein, a miniature CMOS RF SPDT switch (approximately 0.02 mm$^2$) with MCM package and ESD protection can be provided. A biasing strategy generated by the integrated switch controller can also be implemented. By utilizing resistive body-floating technique in CMOS technology (e.g., a standard 0.18 µm bulk CMOS technology), the power handling capability ($IP_{1dB}$) of approximately 21.5/21.1/20.8 dBm can be achieved at approximately 0.9/1.95/2.45 GHz without resorting to voltage doubler, negative voltage generator (NVG), or stacked devices. The worst-case IL and isolation (TX mode) at 85° C. are <0.9 dB and >28 dB, respectively, from approximately 900 MHz up to approximately 2.45 GHz. The integrated switch controller consumes

TABLE 1

| Ref. | Process | Technique | Freq. (GHz) | IL (dB) | Iso (dB) | RL (dB) | $IP_{1dB}$ (dBm) | $IIP_3$ (dBm) | Core Area (mm$^2$) | ESD | Package |
|---|---|---|---|---|---|---|---|---|---|---|---|
| This work | 0.18 µm CMOS | Resistive body-floating | 0.9<br>1.95<br>2.45 | 0.55<br>0.69<br>0.81 | TX: 28<br>TX: 31<br>TX: 33 | 14<br>17<br>21 | 21.5<br>21.1<br>20.8 | 38.5<br>37.8<br>36.9 | 0.02 | >4 KV (HBM)<br>>500 V (MM) | MCM-L |
| A | 0.5 µm CMOS | Low $R_{sub}$ | 0.9 | 0.73 | 41.8 | N.A | 18.9 | 38.2 | 0.1 | No | SOIC |
| B | 0.18 µm CMOS | Impedance transformation | 0.9<br>2.4 | 0.97<br>1.1 | 35.4<br>20.6 | 14<br>16 | 26.3<br>22.7 | 37.7<br>29.8 | 0.1 | No | SOIC |
| C | 0.18 µm CMOS | LC-tuned substrate biasing | 2.4 | TX: 1.5<br>RX: 1.6 | TX: 32<br>RX: 17 | >12 | 28.5 | N.A. | 0.56 (overall chip size) | 4 KV | On-wafer |
| D | 0.18 µm CMOS | Resistive body-floating | 2.4 | 0.7 | 35 | >19 | 21.3 | 30.3 | 0.03 | No | On-wafer |
| E | 0.18 µm CMOS | Body-floating and stacked device with feed-forward caps | 1.8 | TX: 0.75<br>RX: 1.1 | TX: 35<br>RX: 20 | >14 | 33 | N.A. | 0.4 | No | COB |
| F | 0.13 µm CMOS | Body-floating and feed-forward caps | 0.9 | TX: 0.5<br>RX: 1.0 | TX: 37<br>RX: 29 | 20 | 31.3 | 42 | 0.11 | No | On-wafer |

In Table 1, the listed references A-F are as follows: A: F.-J. Huang and K. K. O, "A 0.5-µm CMOS T/R switch for 900-MHz wireless applications," *IEEE J. Solid-State Circuits*, vol. 36, no. 3, pp. 486-492, March 2001. B: F.-J. Huang and K. K. O, "Single-pole double-throw CMOS switches for 900-MHz and 2.4-GHz applications on P-silicon substrates," *IEEE J. Solid-State Circuits*, vol. 39, no. 1, pp. 35-41, January 2004. C: N. Talwalkar, C. Yue, H. Guan, and S. Wong, "Integrated CMOS transmit-receive switch using LC-tuned substrate bias for 2.4 GHz and 5.2 GHz applications," *IEEE J. Solid-State Circuits*, vol. 39, no. 6, pp. 863-870, June 2004. D: M.-C. Yeh, Z.-M. Tsai, R.-C. Liu, K.-Y. Lin, Y.-T. Chang, and H. Wang, "Design and analysis for a miniature CMOS SPDT switch using body-floating technique to improve power performance," *IEEE Trans. Microw. Theory Tech.*, vol. 54, no. 1, pp. 31-39, January 2006. E: M. Ahn, H.-W. Kim, C.-H. Lee, and J. Laskar, "A 1.8-GHz 33-dBm P0.1-dB CMOS T/R switch using stacked FETs with feed-forward capacitors in a floated well structure," *IEEE Trans. Microw. Theory Tech.*, vol. 57, no. 11, pp. 2661-2670, November 2009. F: H. Xu and K. K. O, "A 31.3-dBm bulk CMOS T/R switch using stacked transisonly ~40 µA from a 3.4 V supply. The switch has successfully passed the RF ESD rating of ±2 kV human body model and ±500 V MM, respectively.

Example Applications

As described herein, one or more features associated with the present disclosure can be implemented as a switch circuit. In some embodiments, the switch circuit can include one or more switches having one or more features as described herein. The switch circuit can also include a switch controller having one or more features described herein.

As described herein, the foregoing switch circuit can be implemented on one or more semiconductor die.

Figure 9:
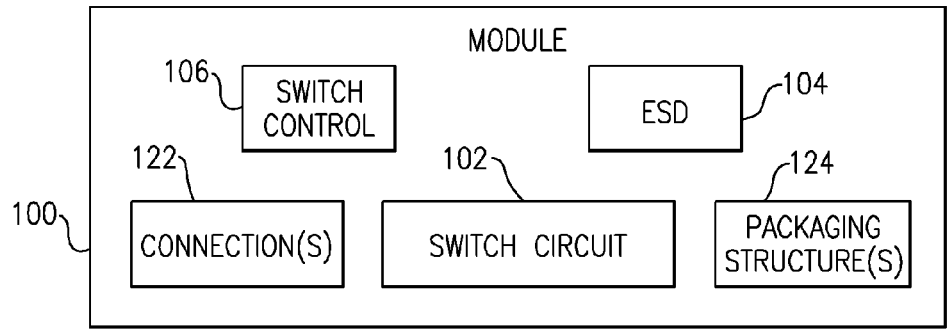
FIG. 9 schematically depicts an example RF module having one or more features of the present disclosure.

FIG. 9 shows that in some embodiments, a switch circuit 102 having one or more features as described herein can be implemented in a packaged module 100. As described herein, the switch circuit 102 can be implemented in one or more dies; and such die(s) can be packaged in the module 100. The module 100 can further include an ESD protection circuit 104. The module 100 can further include a switch controller 106.

The module 100 can further include one or more packaging structures 124 that can provide, for example, protection for the switch circuit 102. The module 100 can further include connection features 122 configured to provide electrical connections to and from the switch circuit 100.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
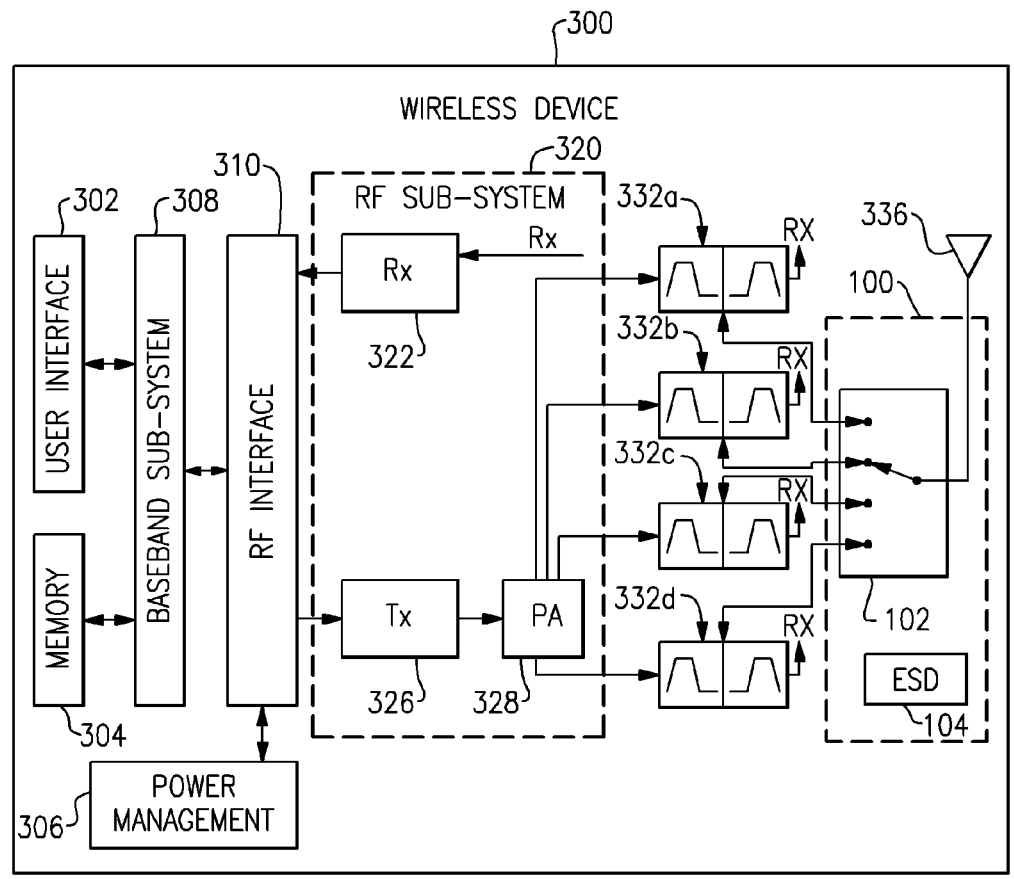
FIG. 10 schematically depicts an example wireless device having one or more features of the present disclosure.

FIG. 10 schematically depicts an example wireless device 300 having one or more advantageous features described herein. The example shown in FIG. 10 is for a frequency-division duplexing (FDD) configuration; however, it will be understood that a wireless device having a time-division duplexing (TDD) configuration can also include and benefit from one or more features as described herein.

In the example wireless device 300 of FIG. 10, an RF sub-system 320 can include a receiver circuit 322 and a transmitter circuit 326. The receiver circuit 322 is shown to receive and process a received (Rx) signal, and generate an output that is provided to a baseband sub-system 308 through an RF interface 310. The transmitter circuit 326 is shown to receive an input from the baseband sub-system 308 through the RF interface 310, and generate an output signal to be amplified by a power amplifier 328 for transmission.

In the example shown, the receiver 322 can be provided with the received (Rx) signal originating from an antenna 336 and routed through a switch 102 and a duplexer 332. Such a received signal can be amplified by an LNA (not shown) before being provided to the receiver 322.

In the example shown, the transmitter 326 can generate the RF signal to be transmitted, and such an RF signal can be amplified by the power amplifier (PA) 328. Such an amplified RF signal can be routed to the antenna 336 through the duplexer 332 and the switch 102.

As described herein, the switch 102 can include one or more CMOS devices, and be configured as described herein (e.g., resistive body-floating). The switch 102 can be a part of a module 100 that can also include an ESD protection circuit 104. In some embodiments, the module 100 can also include an integrated switch controller.

The transmitter 326 and the receiver 322 are shown to interact with the baseband sub-system 308 through the RF interface 310. The baseband sub-system 308 can be configured to provide conversion between data and/or voice signals suitable for a user and RF signals associated with the transmitter 326 and the receiver 322. The RF interface 310 is also shown to be connected to a power management component 306 that is configured to manage power for the operation of the wireless device 300. Such power management can also control operations of the baseband sub-system 308 and other components or sub-systems.

The baseband sub-system 308 is shown to be connected to a user interface 302 to facilitate various input and output of voice and/or data provided to and received from the user. The baseband sub-system 308 can also be connected to a memory 304 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) switching apparatus, comprising:
   a switch implemented as a CMOS device, the switch including a resistive body-floating circuit configured to provide desired power handling capability of the switch;
   an electrostatic discharge (ESD) protection circuit disposed relative to the switch and configured to provide ESD protection for the switch; and
   a controller configured to control the switch, the controller and the switch being integrated, and the controller including a bandgap reference, a low dropout voltage regulator (LDO), and digital logic.

2. The switching apparatus of claim 1 wherein the switch is an N-pole-M-throw switch, N having an integer value greater than 0, M having an integer value greater than 1.

3. The switching apparatus of claim 2 wherein the switch includes a single-pole-double-throw (SPDT) switch.

4. The switching apparatus of claim 1 further comprising a packaging substrate, the switch and the ESD protection circuit being mounted on the packaging substrate.

5. The switching apparatus of claim 4 wherein the packaging substrate is a part of a multi-chip-module (MCM).

6. The switching apparatus of claim 1 wherein the resistive body-floating component is implemented as a CMOS device.

7. The switching apparatus of claim 6 wherein the resistive body-floating component includes a body-floating resistor implemented in a bulk CMOS technology.

8. The switching apparatus of claim 7 wherein the bulk CMOS technology includes a 0.18 μm bulk CMOS technology.

9. The switching apparatus of claim 1 wherein the ESD protection circuit includes one or more diodes.

10. The switching apparatus of claim 1 wherein the ESD protection circuit is implemented at one or more ports of the switch.

11. The switching apparatus of claim 10 wherein the ESD protection circuit is implemented at an antenna port of the switch.

12. A radio-frequency (RF) module, comprising:
a packaging substrate configured to receive a plurality of components;
a switch implemented as a CMOS device and mounted on the packaging substrate, the switch including a resistive body-floating circuit configured to provide desired power handling capability of the switch;
an electrostatic discharge (ESD) protection circuit mounted on the packaging substrate and disposed relative to the switch to provide ESD protection for the switch, and
a controller integrated with the switch and configured to control the switch, the controller including a bandgap reference, a low dropout voltage regulator (LDO), and digital logic.

13. The module of claim 12 wherein the module is a multi-chip-module (MCM).

14. The module of claim 13 wherein the MCM is a laminated MCM (MCML).

15. A wireless device, comprising:
an antenna configured to facilitate transmission and reception of radiofrequency (RF) signals; and
a radio-frequency (RF) module in communication with the antenna, the RF module including a switch implemented as a CMOS device, the switch including a resistive body-floating circuit configured to provide desired power handling capability of the switch, the RF module further including an electrostatic discharge (ESD) protection circuit and a controller, the ESD disposed relative to the switch to provide ESD protection for the switch, the controller integrated with the switch and configured to control the switch, the controller including a bandgap reference, a low dropout voltage regulator (LDO), and digital logic.

* * * * *